US 6,643,174 B2

(12) United States Patent
Hoang

(10) Patent No.: US 6,643,174 B2
(45) Date of Patent: Nov. 4, 2003

(54) EEPROM CELLS AND ARRAY WITH REDUCED WRITE DISTURBANCE

(75) Inventor: Loc B. Hoang, San Jose, CA (US)

(73) Assignee: Winbond Electronics Corporation (TW)

(*) Notice: Subject to any disclaimer, the term of this patent is extended or adjusted under 35 U.S.C. 154(b) by 0 days.

(21) Appl. No.: 10/028,059

(22) Filed: Dec. 20, 2001

(65) Prior Publication Data

US 2003/0117848 A1 Jun. 26, 2003

(51) Int. Cl.[7] .............................................. G11C 16/04
(52) U.S. Cl. ............................. 365/185.11; 365/230.03
(58) Field of Search ........................ 365/185.11, 230.03

(56) References Cited

U.S. PATENT DOCUMENTS 5,452,251 A * 9/1995 Akaogi et al. ............. 365/200
5,592,415 A * 1/1997 Kato et al. ............. 365/185.01
5,812,452 A   9/1998 Hoang

* cited by examiner

Primary Examiner—Richard Elms
Assistant Examiner—Jung H. Hur
(74) Attorney, Agent, or Firm—Townsend and Townsend and Crew LLP

(57) ABSTRACT

A flash electrically-erasable, programmable read-only memory (EEPROM) has multiple source lines and source line select transistors. Each group of memory cells in the EEPROM is associated with one of the source line select transistors. Each source line is associated with more than one group of memory cells. When one group of memory cells is to be programmed, a relatively high voltage is coupled to its corresponding source line. Its corresponding source line select transistor then couples the source line to the group of memory cells to be programmed. In this manner, only the group to be programmed is exposed to the high voltage. This decreases the amount of high voltage stress placed on the other memory cells and increases the reliability and lifetime of the EEPROM.

9 Claims, 3 Drawing Sheets

EEPROM CELLS AND ARRAY WITH REDUCED WRITE DISTURBANCE

CROSS-REFERENCES TO RELATED APPLICATIONS

NOT APPLICABLE

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK.

NOT APPLICABLE

BACKGROUND OF THE INVENTION

The present invention relates to flash electrically-erasable, programmable read-only memories (EEPROMs). In particular, the present invention relates to flash EEPROMs having selectable source connections.

U.S. Pat. No. 5,812,452 (which is incorporated herein by reference in its entirety for all purposes) describes a block accessible flash EEPROM. Each memory cell includes two transistors: a select transistor and a storage transistor. The select transistor is connected in series with the storage transistor. When placed in a memory array, a predefined number of memory cells can be grouped into blocks. By using a block select transistor, the memory cells can be accessed and altered on a block-by-block basis.

One issue is not disclosed in U.S. Pat. No. 5,812,452. During a programming (write) operation on selected memory cells, the unselected memory cells that share the same source connection with the selected memory cells will be exposed to a high voltage stress of approximately 12 volts. This high voltage stress may eventually degrade these unselected cells, possibly causing these cells to alter their storage states (i.e., to fail) depending upon the level of stress and its duration. Such a condition is termed write disturbance.

There is a need for a flash EEPROM architecture that does not expose unselected memory cells to high voltage stress.

BRIEF SUMMARY OF THE INVENTION

According to one embodiment, a flash EEPROM includes a plurality of groups of memory cells, one or more source lines, and a plurality of source select transistors. The source lines are coupled to selectively provide a source voltage. The source select transistors are configured to selectively couple the source lines to selected groups of memory cells. In a programming operation, selected source lines are charged to the source voltage. Selected source select transistors then couple the selected source lines to the selected groups of memory cells. In this manner, only the selected groups of memory cells are exposed to the source voltage. For the groups of memory cells that are not selected, their source select transistors do not couple them to their source lines, so the unselected groups of memory cells are not exposed to the source voltage.

A fuller explanation of the embodiments of the present invention is made with reference to the following figures and detailed description.

DETAILED DESCRIPTION OF THE INVENTION

Figure 1:
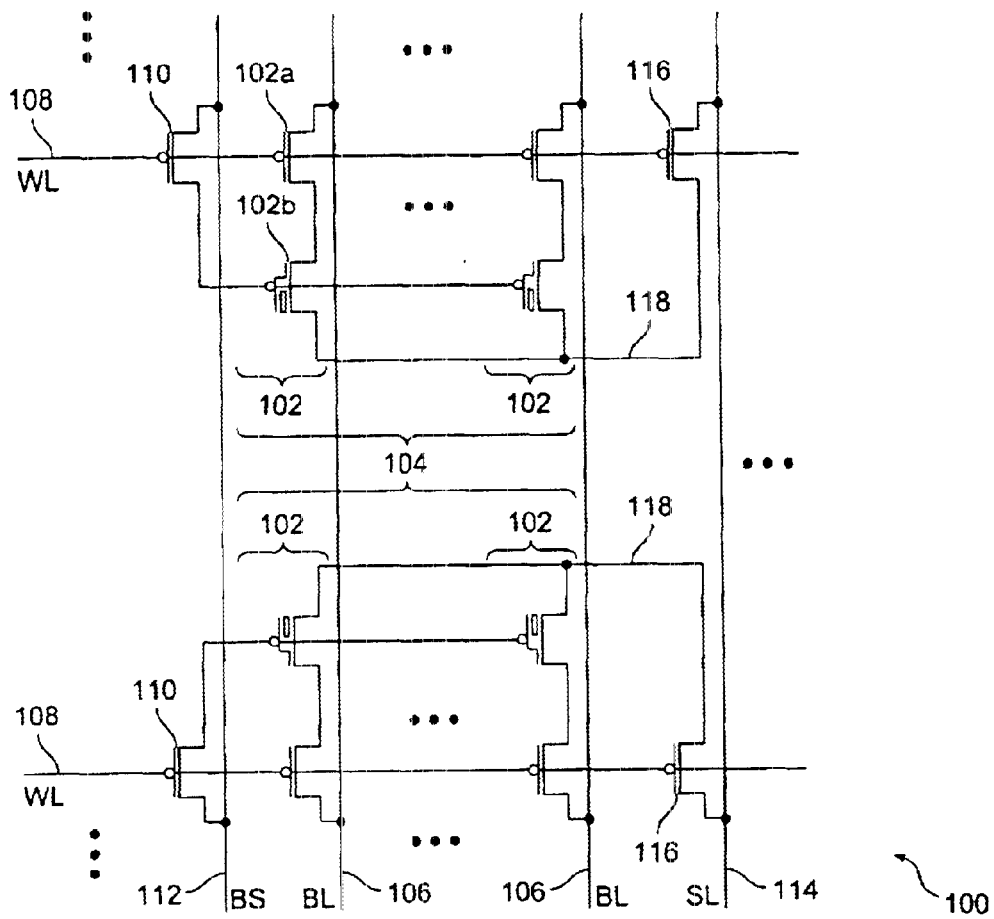
FIG. 1 is a circuit diagram of a portion of an EEPROM according to an embodiment of the present invention.

FIG. 1 is a circuit diagram of a portion of a flash EEPROM 100 according to one embodiment of the present invention. The EEPROM 100 includes a large number of memory cells 102. Each memory cell 102 includes a select transistor 102a and a storage transistor 102b preferably as described in U.S. Pat. No. 5,812,452. However, the use of such memory cells is not required, and the invention may be applied to any type of EEPROM memory cell with only minor (if any) deviation from the following description.

The memory cells 102 are organized into a number of groups 104. The groups may also be referred to as blocks. Each group 104 as shown in FIG. 1 includes eight memory cells 102 (although only two are shown). Each group 104 is the basic accessible and addressable unit of the EEPROM 100; as shown, each group 104 of eight memory cells 102 forms an eight-bit byte. The number of memory cells 102 in each group 104 may be changed according to design criteria. For example, embodiments having four, 16, 24, 32, 48, 64, 128 or 256 (or other numbers) memory cells 102 are contemplated.

Two groups 104 are shown in the portion of EEPROM 100 illustrated in FIG. 1. Additional groups 104 may extend horizontally in rows or vertically in columns, or in other configurations.

Also running vertically are bit lines 106. Each memory cell 102 in a group 104 has its own bit line 106. Each bit line 106 allows access to a particular bit to be read from or written to each memory cell 102. Shown in FIG. 1 are the bit lines 106 associated with the first and last bits of each group 104. Thus, for the embodiment with eight memory cells 102 per group 104, there will be eight corresponding bit lines 106. Embodiments having other numbers of memory cells 102 will have other corresponding numbers of bit lines 106. The bit lines 106 allow vertical (column) access to the memory cells 102. The other columns of groups 104 (not shown) have D corresponding bit lines 106 (not shown).

Running horizontally are word lines 108. The word lines 108 allow horizontal (row) access to the groups 104. Block select transistor 110, along with a block select line 112, control the horizontal access. Although only two rows are shown in FIG. 1, additional rows may be present, and each may have its own corresponding word line 108.

Therefore, each group 104 may be accessed by a unique combination of the block select line 112 and a selected one of the word lines 108. For example, the word line 108 controls the block select transistor 110 to couple the block select line 112 to the gates of the storage transistors of the memory cells 102. This provides horizontal access to all the groups 104 on that row. The access to a particular group 104 is then determined by which of the block select lines 112 is selected. The block select lines 112 may be selected by column address decoder and Y-mux circuit 132 (see FIG. 2). The data in the memory cells 102 in the selected group 104 may then be written or read using the appropriate bit lines 106.

A source line 114 provides a source voltage to the groups 104. Although only one source line 114 is shown in FIG. 1, each column of groups has an associated source line 114. As described in the background of the invention, during a programming (write) operation, the source line is charged to approximately 12 volts.

Source select transistors 116 selectively couple the source line to the source connections of the memory cells 102 via source sublines 118. Therefore, the transistors 116 allow the high voltage to be applied to the groups 104 to be programmed, but isolate the high voltage from the groups 104 that are not to be programmed.

The source select transistors 116 are controlled by the word lines 108, thereby providing horizontal access. Vertical access is controlled by selecting particular ones of the source lines 114 to be charged to the high voltage. The source lines 114 may be selected by the column address decoder and Y-mux circuit 132 (see FIG. 2). In this manner, a particular group 104 may be programmed according to its unique x-y coordinate mapping as accessed by a particular word line 108 and a particular source line 114. The source select transistors 116 are preferably of the same type (e.g., N-type) as the block select transistors 110. Of course, other types of integrated circuits, gates or switches may be used having the same or similar controllable functionality.

As shown in FIG. 1, the select transistor 102a is placed away from the floating gate of the storage transistor 102b, and one terminal of the select transistor 102a is connected as a drain terminal to the bit line 106. (This arrangement corresponds to Configuration 1 of U.S. Pat. No. 5,812,452.) In a programming operation, the source of the memory cell 102 to be programmed should be approximately 12 volts. The word line 108, then, needs to be charged to higher than 12 volts in order to account for the threshold voltage of the source select transistor 116. For example, if the threshold voltage of the source select transistor 116 is two volts, then the word line 108 should be charged to approximately 14 volts, or even higher. The selected source line is supplied with approximately 12 volts, which corresponds to the source voltage level for programming the memory cell 102.

Besides the configuration shown in FIG. 1, other configurations may be implemented with only minor alterations in the connections and voltage levels. One alternative configuration is a memory cell having the select transistor placed away from the floating gate of the storage transistor and connected to the source subline. (This arrangement corresponds to Configuration 2 of U.S. Pat. No. 5,812,452.) Another alternative configuration is a memory cell having the select transistor placed near the floating gate of the storage transistor and connected to the drain terminal. (This arrangement corresponds to Configuration 3 of U.S. Pat. No. 5,812,452.) Yet another alternative configuration is a memory cell having the select transistor placed near the floating gate of the storage transistor, and one terminal of the select transistor is connected to the drain terminal. (This arrangement corresponds to Configuration 4 of U.S. Pat. No. 5,812,452.)

Figure 2:
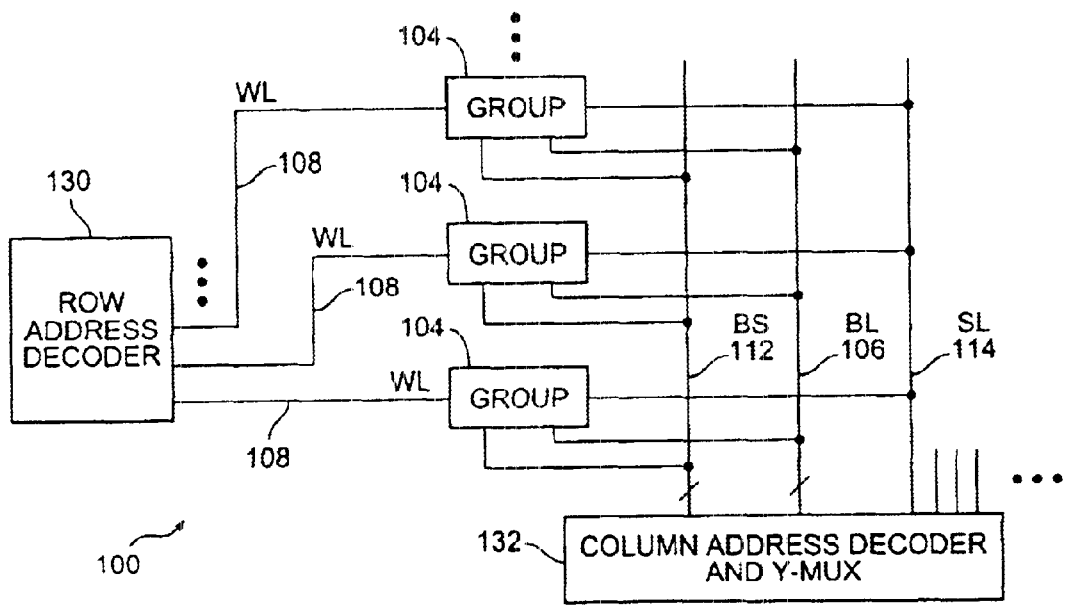
FIG. 2 is a block diagram of a portion of an EEPROM according to an embodiment of the present invention.

FIG. 2 is a higher-level block diagram of a portion of the EEPROM 100. FIG. 2 shows three groups 104 arranged in a column. Additional groups 104 in that column, and additional groups 104 in rows, may exist and are not shown. The word lines 108 associated with the additional groups 104 are also not shown. Each group 104 has an associated block select transistor 110 and source select transistor 116 (as shown in FIG. 1), but these are not shown in FIG. 2.

The column of groups 104 has bit lines 106, block select lines 112, and the source line 114. Additional columns may exist and are not shown. The block select lines 112, the bit lines 106 and the source lines 114 associated with the additional columns are also not shown.

The word lines 108 are selected via a row address decoder circuit 130. The block select lines 112, the bit lines 106 and the source lines 114 are selected via the column address decoder and Y-mux circuit 132. (Alternatively, the source lines 114 may be selected via a separate decoder circuit.) In this manner, a particular group 104 may be selected and the memory cells 102 therein may be programmed or subjected to other operations.

FIGS. 3A–3D are high-level block diagrams of other embodiments of the EEPROM 100. The differences result from associating different numbers of source select transistors 116 with the groups 104. With one source select transistor 116 associated with one group 104, as in FIGS. 1 and 2, each group 104 can be isolated from all the other groups 104 associated with the same source line 114. This provides the maximum level of protection from write disturbance. However, if a reduced level of protection is acceptable, one source select transistor 116 may be associated with more than one group 104. In such a case, those groups 104 associated with that particular source select transistor 116 are all exposed to high voltage stress when one of them is programmed, but the other groups 104 on the same source line 114 that are associated with other source select transistors 116 are not exposed to the high voltage stress. Considerations such as available silicon chip or wafer area may indicate a reduced ratio of source select transistors 116 to groups 104. Therefore, a designer can implement a tradeoff between the reduced complexity of fewer source select transistors 116 versus a higher level of protection from write disturbance for the EEPROM 100.

Figure 3A:
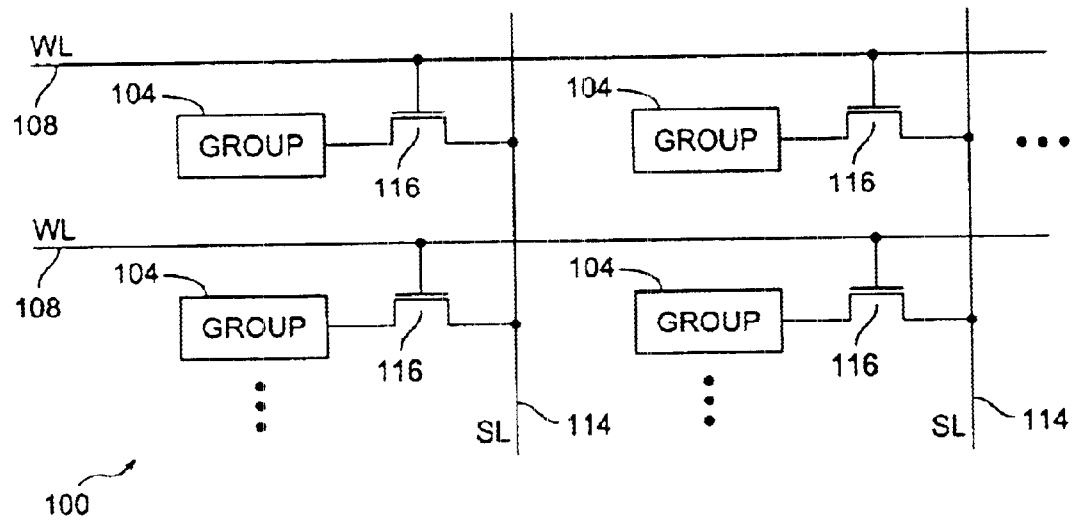
FIGS. 3A–3D are block diagrams of portions of EEPROMs according to other embodiments of the present invention.

FIG. 3A shows four groups 104 arranged in rows (of which two are shown) and columns (of which two are shown). (Actually, FIG. 3A corresponds to the embodiments shown in FIGS. 1 and 2 in that each group 104 is associated with one source select transistor 116 and each column is associated with one source line 114. However, FIG. 3A is useful for comparison purposes with the other FIGS. 3B–3D.) The word lines 108 control the source select transistors 116.

Figure 3B:
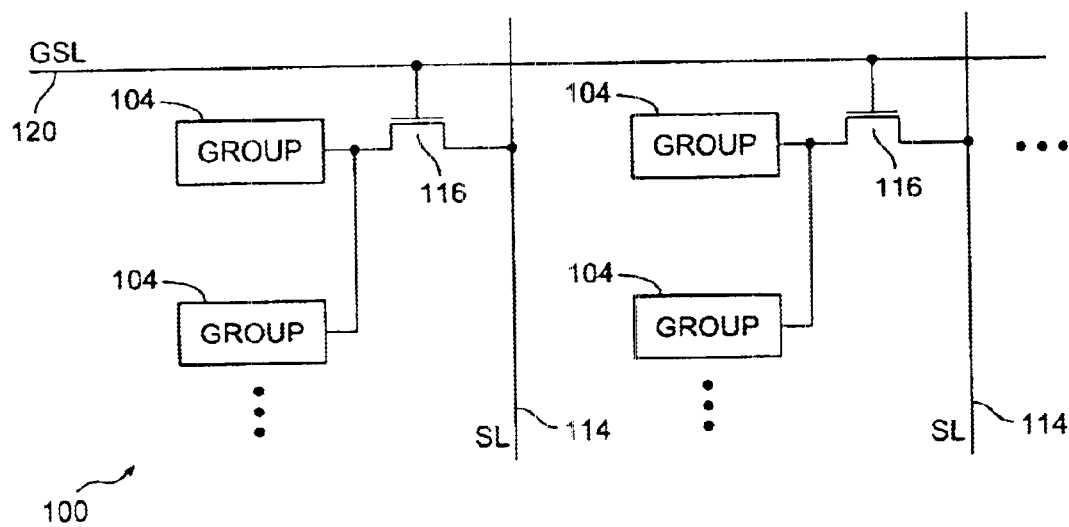

FIG. 3B shows four groups 104 in two columns with one source line 114 associated with each column. FIG. 3B differs from FIG. 3A in that each source select transistor 116 is associated with more than one group 104 in a column. The source select transistors 116 are controlled by a group select line 120. The group select line 120, which can be decoded in a manner similar to that performed by the row address decoder 130 (see FIG. 2), provides horizontal access to the gate of the source select transistors 116. The group select line 120 should be decoded such that it is selected ON if any of the word lines 108 associated with each group 104 sharing the same source select transistor 116 is selected. In other words, the group select line 120 is the logical OR of all the word lines 108 of groups 104 that share the same source select transistor 116.

As shown in FIG. 3B, each source select transistor 116 is associated with two adjacent groups 104. However, each source select transistor 116 may be associated with more groups 104 (e.g., three, four, or more) or groups 104 that are not necessarily adjacent.

Figure 3C:
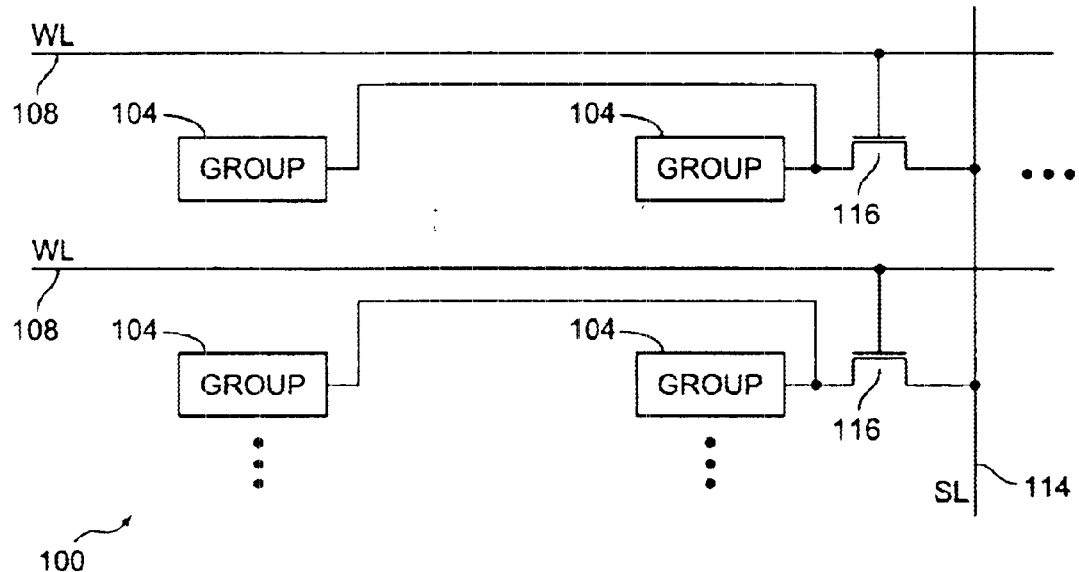

FIG. 3C shows four groups 104 in two columns with one source line 114 associated with more than one column. Each source select transistor 116 is associated with more than one group 104 in a row. As shown in FIG. 3C, each source select transistor is associated with two adjacent groups 104. However, each source select transistor 116 may be associated with more groups 104 (e.g., three, four, or more) or groups 104 that are not necessarily adjacent.

Figure 3D:
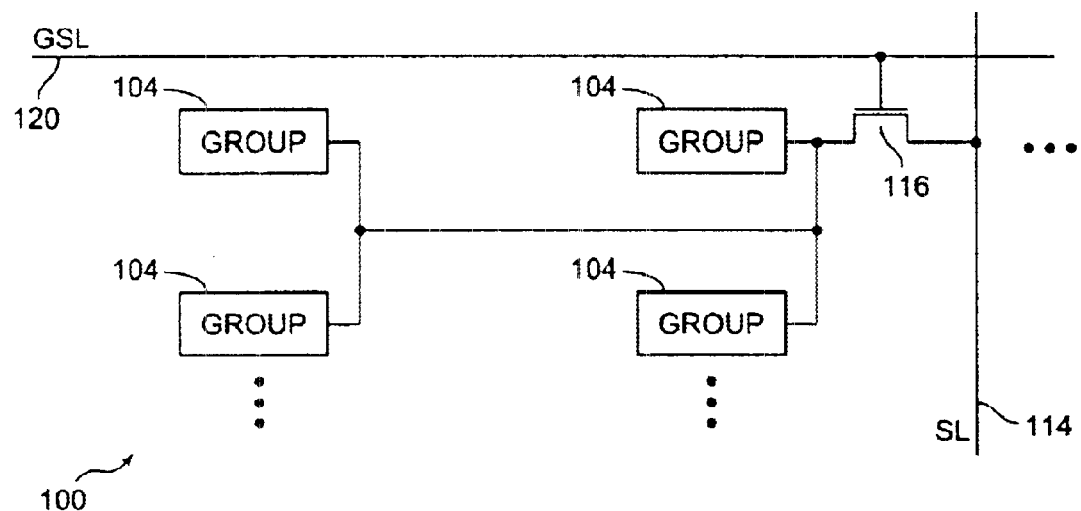

FIG. 3D shows four groups 104 in two columns with one source line 114 associated with both columns. This embodiment is similar to FIG. 3B in that the group select line 120 controls the source select transistor 116. Although only two columns are shown in FIG. 3D, additional columns may exist and may be associated with one source line 114. Each source select transistor 116 is associated with more than one group 104 in a row and more than one group 104 in a column. As shown in FIG. 3D, each source select transistor 116 is associated with four adjacent groups 104. However, each source select transistor 116 may be associated with more groups 104 (e.g., five, six, or more) or groups 104 that are not necessarily adjacent.

The present invention is useful in EEPROM applications having relatively small data block units that are frequently updated; for example, smart cards. In such applications the unselected memory cells would otherwise be exposed to high voltage stress, which could lead to failure of the memory cells. However, using the present invention to isolate groups of memory cells from the high voltage on the source lines reduces the write disturbance.

Although the above description has focused on specific embodiments, various alternatives and their equivalents are considered to be within the scope of the present invention, which is defined by the following claims.

What is claimed is:

1. A flash electrically-erasable, programmable read-only memoy (EEPROM), comprising:
   a plurality of groups of memory cells configured to store information;
   one or more source lines coupled to selectively provide a source voltage;
   a plurality of source select transistors configured to selectively couple said one or more source lines to a selected one or more of said plurality of groups of memory cells to provide said source voltage thereto in accordance with a programming operation thereof; and
   a plurality of word lines coupled to control said plurality of groups of memory cells.

2. The flash EEPROM of claim 1, further comprising:
   a decoder circuit coupled to selectively provide said source voltage to said one or more source lines.

3. The flash EEPROM of claim, 1, wherein said plurality of groups of memory cells are organized into a plurality of columns, and wherein each of said one or more source lines is associated with a corresponding one of said plurality of columns.

4. The flash EEPROM of claim 1, wherein said plurality of groups of memory cells are organized into a plurality of columns, and wherein each of said one or more source lines is associated with two or more of said plurality of columns.

5. The flash EEPROM of claim 1, wherein each of said plurality of source select transistors is associated with exactly one of said plurality of groups of memory cells.

6. The flash EEPROM of claim 1, wherein each of said plurality of source select transistors is associated with more than one of said plurality of groups of memory cells.

7. The flash EEPROM of claim 1, wherein said plurality of word lines is further coupled to control said plurality of source select transistors.

8. The flash EEPROM of claim 1, further comprising:
   one or more group select lines coupled to control said plurality of source select transistors.

9. The flash EEPROM of claim 1, further comprising:
   a plurality of source sublines coupled between said plurality of groups of memory cells and said plurality of source select transistors.

* * * * *